United States Patent [19]

Aoki et al.

[11] Patent Number: 5,366,922
[45] Date of Patent: Nov. 22, 1994

[54] METHOD FOR PRODUCING CMOS TRANSISTOR

[75] Inventors: Kenji Aoki; Naoto Saito, both of Tokyo, Japan

[73] Assignee: Seiko Instruments Inc., Tokyo, Japan

[21] Appl. No.: 155,341

[22] Filed: Nov. 22, 1993

Related U.S. Application Data

[63] Continuation of Ser. No. 839,689, Feb. 24, 1992, abandoned, which is a continuation of Ser. No. 623,163, Dec. 6, 1990, abandoned.

[30] Foreign Application Priority Data

Dec. 6, 1989 [JP] Japan ................. 1-318552
Dec. 6, 1989 [JP] Japan ................. 1-318559
Dec. 6, 1989 [JP] Japan ................. 1-318561

[51] Int. Cl.$^5$ ............................ H01L 21/80
[52] U.S. Cl. .................... 437/57; 437/160; 437/913; 148/DIG. 34
[58] Field of Search ............. 437/57, 913, 160

[56] References Cited

U.S. PATENT DOCUMENTS

| | | | |
|---|---|---|---|
| 3,506,508 | 4/1970 | Nickl | 437/974 |
| 4,242,691 | 12/1980 | Kotani et al. | |
| 4,381,202 | 4/1983 | Mori et al. | 437/34 |
| 4,395,433 | 7/1983 | Nagakubo et al. | |
| 4,441,932 | 4/1984 | Akasaka et al. | |
| 4,626,450 | 12/1986 | Tani et al. | 437/34 |
| 4,737,471 | 4/1988 | Shirato et al. | |
| 4,791,074 | 12/1988 | Tsunashima et al. | 437/160 |
| 4,855,258 | 8/1989 | Allman et al. | 437/946 |
| 4,861,729 | 8/1989 | Fuse et al. | |
| 4,879,255 | 11/1989 | Deguchi et al. | 437/57 |
| 4,891,326 | 1/1990 | Koyanagi | 437/57 |
| 4,940,505 | 7/1990 | Schachameyer et al. | 437/946 |
| 4,966,861 | 10/1990 | Mieno et al. | 148/DIG. 17 |
| 4,968,639 | 11/1990 | Bergonzoni | 437/57 |
| 4,996,168 | 2/1991 | Ozaki et al. | 437/154 |

FOREIGN PATENT DOCUMENTS

| | | |
|---|---|---|
| 316165A3 | 5/1989 | European Pat. Off. . |
| 0322921 | 7/1989 | European Pat. Off. . |
| 0413982 | 2/1991 | European Pat. Off. . |
| 62-271475 | 11/1987 | Japan . |
| 0166220 | 7/1988 | Japan . |
| 63-166220 | 7/1988 | Japan . |
| 0192266 | 8/1988 | Japan ................. 437/56 |
| 63-239939 | 10/1988 | Japan . |
| 1192159 | 8/1989 | Japan . |
| 8201380 | 10/1981 | WIPO . |

OTHER PUBLICATIONS

"Metal–Oxide–Silicon Field–Effect Transistor Made by Means of Solid–Phase Doping", by Gong et al.; J. Appl. Phys. 65 (11), 1 Jun. 1989.

"Ultrashallow, high doping of boron using molecular layer doping", by Nishizawa; Applied Physics Letters; 5b(1990) 2 Apr., No. 14, Leung, D. L., et al., "CMOS Devices Fabricated in Thin Epitaxial Silicon on Oxide", 1989 IEEE SOS/SOI Technology conference, Oct., 1989, pp. 74–75.

Simple-structured PMOSFET Fabricated Using Molecular Layer Doping; Nishizawa et al.; Electron Device Letters No. 3, 11 (1990) Mar., pp. 105–106.

Primary Examiner—Tom Thomas
Assistant Examiner—Michael Trinh
Attorney, Agent, or Firm—Spensley Horn Jubas & Jubas

[57] ABSTRACT

The method of producing a CMOS transistor device. A pair of device regions are formed in separated relation from each other by a field oxide film on a pair of corresponding well regions formed in a semiconductor substrate. A gate insulating film and a gate electrode is sequentially formed on each of the device regions. The gate insulating film is removed through a mask of the patterned gate electrode to expose a silicon active surface at least in one of the device regions. A diborane gas containing P type impurity of boron is applied to the silicon active surface to form thereon a boron absorption film. N type impurity of arsenic is doped into the other device region by ion implantation to form N type of source and drain regions while masking the one device region. The boron is diffused from the adsorption film into the one device region to form P type of source and drain regions by annealing of the substrate.

3 Claims, 12 Drawing Sheets

METHOD FOR PRODUCING CMOS TRANSISTOR

This is a continuation of application Ser. No. 07/839,689 filed Feb. 24, 1992, and now abandoned, which is itself a continuation of application Ser. No. 07/623,163 filed Dec. 6, 1990, also abandoned.

BACKGROUND OF THE INVENTION

The present invention relates to the method of producing a complementary Metal Insulator Semiconductor filed effect transistor (hereinafter, referred to as "CMOS transistor").

In the conventional method of producing a CMOS transistor, ion implantation technology is utilized to dope N type impurity and P type impurity into a semiconductor substrate so as to form a pair of N type source and drain regions and another pair of P type source and drain regions.

However, according to the ion implantation technology, since the doped impurities have a depth profile of density in the form of Gaussian distribution, the impurities are distributed broadly in the depth direction. Therefore, the impurity distribution cannot be confined in a relatively shallow portion of the semiconductor material, thereby causing problem that scaling-down of the device cannot easily be performed. Since the source and drain regions formed by the ion implantation have a relatively great junction depth, the CMOS transistor device cannot be operated satisfactorily at submicron channel length.

SUMMARY OF THE INVENTION

In view of the above noted drawbacks of the prior art, an object of the present invention is to provide an improved method of producing a CMOS transistor device with using a new impurity doping technology effective to form in a semiconductor layer a source region and a drain region having a relatively small junction depth.

In order to achieve the above noted object, in the invention method of producing a CMOS transistor device, the first step is carried out such that a pair of device regions are formed separately from each other by a field oxide film on a pair of corresponding well regions having opposite conductivity types and being disposed adjacent to each other in a semiconductor substrate. Subsequently in the second step, a gate insulating film and a gate electrode are formed in each of the device regions. Then in the third step, impurities of opposite conductivity types are introduced into the corresponding device regions to form source and drain regions. In this treatment, a new impurity doping technology is applied to at least one of the device regions to form a pair of source and drain regions having a small junction capacitance. This new impurity doping technology may be selectively applied, with priority, to preferable one of the pair of device regions to achieve most efficient effects. Namely in the third step, the gate insulating film is partly removed in the selected one of the device regions so as to effect cleaning treatment to expose an active surface of semiconductor material. Then, a source gas having an impurity component of one conductivity type is applied to the active surface to deposit thereon an adsorption film containing the impurity component of the one conductivity type. In the fourth step, another impurity component of another conductivity type is introduced into the nonselected or remaining device region to form a pair of source and drain regions of said another conductivity type. Lastly, in the fifth step, the solid-phase diffusion of the impurity component is effected from a diffusion source of the adsorption film to form a pair of source and drain regions of said one conductivity type in the selected device region. The formation of source and drain regions of said another conductivity type can be carried out by the conventional ion implantation technology. Otherwise, said another conductivity type impurity component may be introduced by means of the new impurity doping method in manner similar to the third and fifth steps.

For example, a diborane gas containing a P type of impurity boron is applied to the semiconductor active surface in one of the device regions to deposit an adsorption film composed of the P type impurity boron. Then, the solid-phase diffusion of the impurity boron is effected from a diffusion source of the adsorption film to form a pair of source and drain regions of P conductivity type in the semiconductor layer. On the other hand, N type of impurity arsenic is introduced into the other device region by ion implantation to form N conductivity type of source and drain regions.

According to the invention, a source gas containing an impurity component is applied to an active surface of a semiconductor layer to deposit an impurity adsorption film. The impurity adsorption amount can be quite easily adjusted by regulating gas pressure and gas charging time interval. The solid-phase diffusion of impurity component is carried out from a diffusion source composed of the impurity adsorption film into the semiconductor layer to form a pair of source and drain regions. The adsorbed amount of impurity is adjusted so as to form a significantly shallow and confined impurity diffusion region to reduce a junction capacitance of the source and drain regions. This new method is particularly effective to introduce P type of impurity boron. Namely, the P type impurity of boron atom has a mass smaller than that of N type impurity of arsenic atom. Accordingly, when doping the boron atoms by the conventional ion implantation technology, its depth profile of the density would be broad as twice as that of the arsenic atoms. Therefore, it would be difficult to reduce a junction depth of the source and drain regions.

DETAILED DESCRIPTION OF THE INVENTION

Hereinafter, various embodiments of the invention will be described in detail with reference to the attached drawings. FIGS. 1A–1E are a step diagram showing a first embodiment of the inventive method of producing a CMOS transistor device. In the FIG. 1A step, there is provided a silicon substrate 1 of P type. A pair of an N well region 2 and a P well region 3 are formed adjacently to each other on a surface of the silicon substrate 1. A field oxide film 4 is formed by, for example, selective thermal oxidation on the silicon substrate surface after a given pattern. A device region 5 is surrounded by the field oxide film 4 and is placed over the N well region 2. Another device region 6 is also defined over the P well region 3.

Figure 1A:
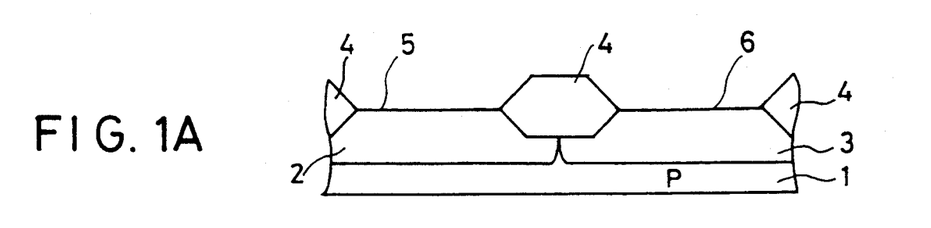
FIGS. 1A–1E are a step diagram showing a first embodiment of the inventive method of producing a CMOS transistor device.
Figure 1B:
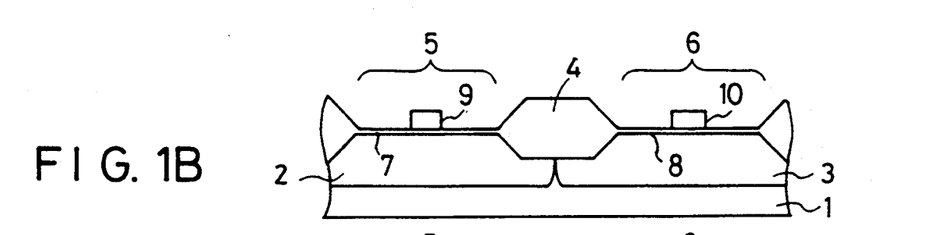

In the FIG. 1B step, a gate oxide film 7 is coated over the device region 5 and another gate oxide film 8 is coated over the other device region 6. Subsequently, a gate electrode 9 is formed on the gate oxide film 7, and another gate electrode 10 is formed on the other gate oxide film 8. These gate electrodes 9 and 10 are obtained by depositing a polysilicon film by chemical vapor deposition technology and subsequently by patterning the polysilicon film by photolithography technology and etching technology.

Figure 1C:
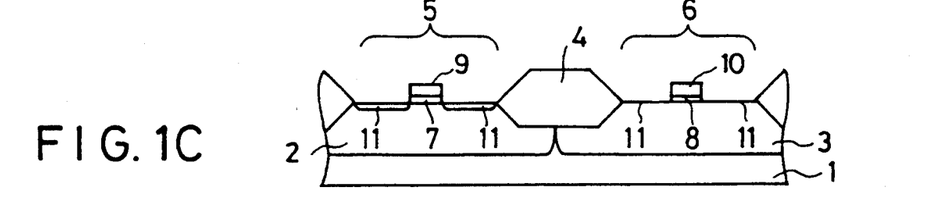

In the FIG. 1C step, a part of the gate oxide films 7 and 8 is removed through a mask composed of the gate electrodes 9 and 10, and then an uncovered surface of the device regions 5 and 6 is cleaned or activated to expose an active surface of silicon material. Then, a diborane gas containing an impurity component of boron is applied to the substrate 1 to selectively deposit an adsorption film 11 containing the impurity boron on the cleaned active surface of silicon layer in the device regions 5 and 6. The diborane gas is firmly and stably adsorbed only on the active face of silicon layer and is not deposited substantially on the field oxide film 4.

Figure 1D:
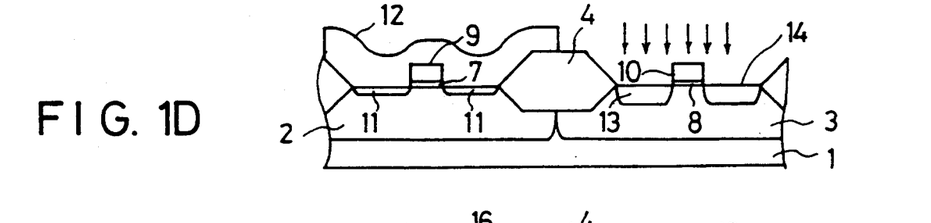

In the FIG. 1D step, the device region 5 is coated by a resist film 12, while the other device region 6 is uncovered. Then, N type of impurity arsenic is introduced into the uncovered device region 6 in an amount sufficiently greater than that of boron contained in the impurity film 11 deposited in the FIG. 1C step to form a pair of N+ type source region 13 and N+ type drain region 14. Consequently, on N channel insulating gate field effect transistor or NMOS is formed in the device region 6. The arsenic atoms are doped into the device region 6 by ion implantation through a mask of the gate electrode 10.

Figure 1E:
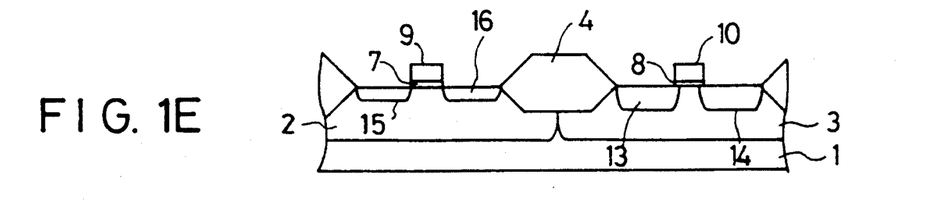

In the FIG. 1E. step, the resist film 12 is removed and substrate 1 is subjected to thermal treatment. By heating or annealing of the substrate, the impurity boron is diffused from the impurity adsorption film 11 into a bulk of the N well region 2 by solid-phase diffusion so as to form P+ type source region 15 and P+ type drain region 16. The amount of impurity boron contained in the adsorption film 11 is optimumly set such that boron atoms are limitatively diffused to form the shallow source region 15 and the drain regions 16 having a small junction depth. Consequently, a P channel MIS field effect transistor or PMOS is formed in the device region 5. The impurity of arsenic doped into the other device region 6 is also concurrently activated by this thermal treatment.

As apparent from the above description, the inventive production method is characterized essentially by sequential treatments of surface activation of the silicon layer, adsorption of impurity onto the activated surface, and diffusion of the impurity. These sequential treatments are carried out by an impurity doping apparatus shown in FIG. 2. The FIG. 2 apparatus is provided with a vacuum chamber 22 made of quartz for containing centrally therein a silicon substrate 1 formed with a pair of device regions 5 and 6. A temperature of the substrate 1 is held at a given level by controlling a heating system 23 utilizing an infrared lamp heater or resistance heater. Inside of the chamber 22 is evacuated by a high vacuum evacuation system 24 comprised of plural pumps including a main pump composed of a turbo molecular pump. Vacuum degree inside the chamber 22 is measured by a pressure gage 25. Transportation of the silicon substrate 1 is carried out by utilizing a transportation mechanism 28 from a loading chamber 27 to the chamber 22 which is connected to the loading chamber 27 through a gate valve 26a which is held open during the transportation. The loading chamber 27 is normally evacuated by another evacuation system 29 while opening a gate valve 26b except during the supply of silicon substrates to the loading chamber 27 and during the transportation of silicon substrates. A gas supply source 31 is connected to the chamber 22 through a gas flow control system 30. The gas supply source 31 is provided with a plurality of bottles for storing source gas species needed for the sequential treatments. The gas flow control system 30 is utilized to control selection of gas species, charging amount and charging time interval of a source gas which is introduced from the gas supply source 31 to the chamber 22.

Figure 2:
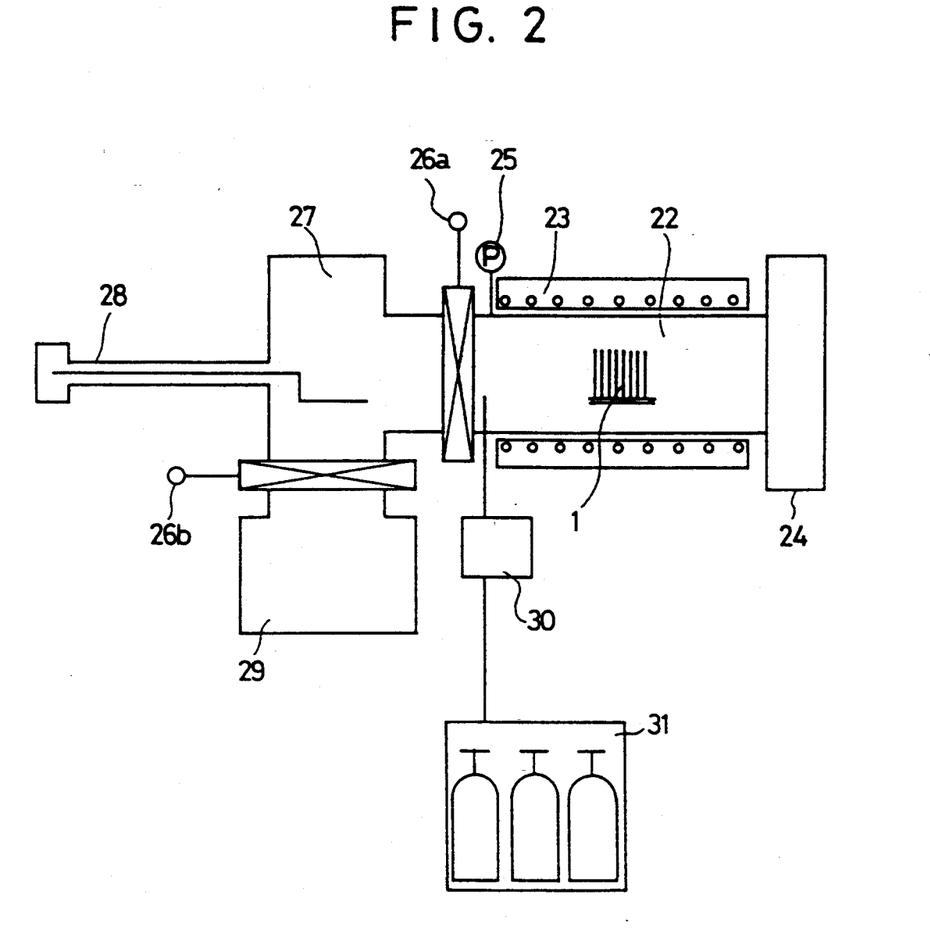
FIG. 2 is a block diagram showing an impurity doping apparatus.

Next, the detailed description is given for the inventively essential treatments of surface activation of semiconductor layer, adsorption of impurity and diffusion of impurity with reference to FIG. 2. The silicon substrate 1 is placed in a central portion of the vacuum chamber 22 which is evacuated at less than $1 \times 10^{-4}$ Pa of the background pressure. Then the substrate temperature is set at 850° C. by using the heating system 23, and hydrogen gas is introduced from the gas supply source 31 into the chamber at about $1 \times 10^{-2}$ Pa for a given time interval. By this treatment, an inert film or natural oxide film is removed from the silicon layer of the substrate to expose a chemically active face of silicon. After finishing cleaning of the silicon layer surface, the hydrogen is stopped and the substrate temperature is set to 800° C. After reaching stably this set temperature, the active surface of the silicon layer is applied with a source compound gas containing diborane having boron element and being diluted to 5% by nitrogen gas, which is fed from the gas supply source 31. The source gas is charged for a given time internal into the chamber 22 at $1 \times 10^{-2}$ Pa of internal chamber pressure, thereby forming an adsorption film containing boron element or boron compound. This adsorption film is firmly fixed to the active surface in quite stable state. The adsorption amount is proportional to the charging pressure and charging time interval of the diborane gas. Therefore, these parameters are adequately set to obtain an optimum adsorption amount of boron. Lastly, the substrate 1 is annealed to diffuse the boron atoms into the semiconductor layer. Namely, after forming the adsorption film, the diborane gas is stopped and the substrate 1 is heated for a given time interval in vacuum to effect diffusion of the impurity from a diffusion source of the adsorption film into the silicon layer. The diffused impurity atoms of boron are activated simultaneously. In the above described embodiment, diborane gas is utilized to form source and drain regions in the silicon layer. However, P type of impurity adsorption film can be formed by other gaseous compounds of III-group elements such as trimethyl gallium (TMG) and boron trichloride ($BCl_3$). The ion implantation technology is utilized to dope N type of impurity into the silicon semiconductor layer in the above embodiment. However, in similar manner to the formation of P type source and drain regions, a source gas containing N type of impurity component may be utilized to form an adsorption film containing the N type impurity component to effect diffusion of the N type impurity from the adsorption film. Such compound gas may be selected from arsine ($AsH_3$), phosphorus trichloride ($PCl_3$), antimony pentachloride ($SbCl_5$) and phosphine ($PH_3$).

Figure 3A:
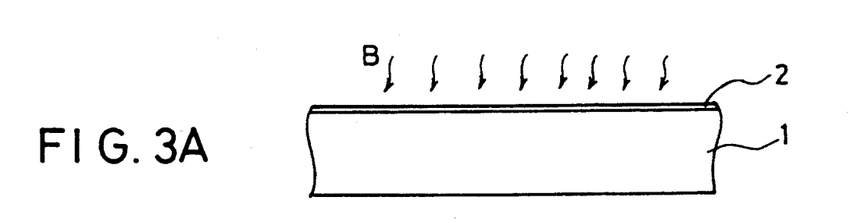
FIGS 3A–3C are a step diagram showing a variation of the first embodiment.
Figure 3B:
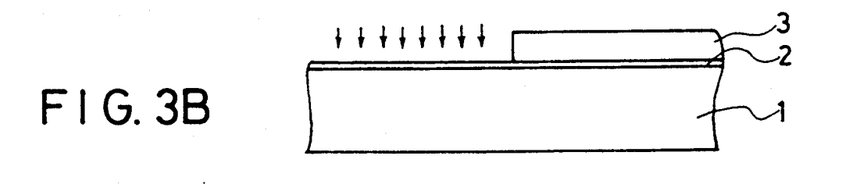
Figure 3C:
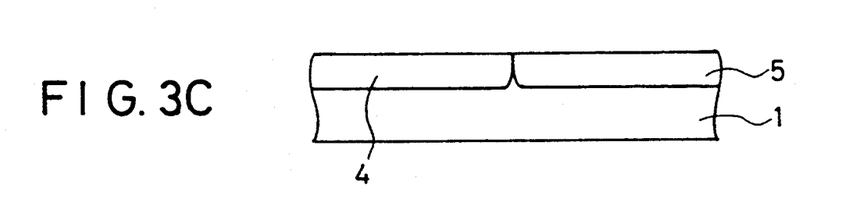

FIGS. 3A–3C are a step diagram showing a variation of the first embodiment of producing a CMOS transistor device. In the FIG. 3A step, an N type substrate 1 is prepared. A natural oxide film is removed from a surface of the substrate 1 to expose an active silicon face. Subsequently, a diborane gas containing an impurity component of boron is applied to the substrate 1 to deposit an adsorption film 2 having the impurity boron.

In the FIG. 3B step, a part of the substrate 1 is covered with a resist film 3, and then N type impurity of arsenic is doped by ion implantation into the substrate 1 to form an N type well region 4.

In the FIG. 3C step, the resist film 3 is removed, and thereafter the substrate 1 is subjected to thermal treatment. By this heating or annealing, the impurity boron is diffused from the impurity adsorption film 2 into the bulk of the substrate 1 by solid-phase diffusion to form a P type well region 5. Thereafter a CMOS transistor device is formed on a silicon layer in the form of N type well region 4 and P type well region 5 in manner similar to the FIGS. 1A–1E steps.

Figure 4:
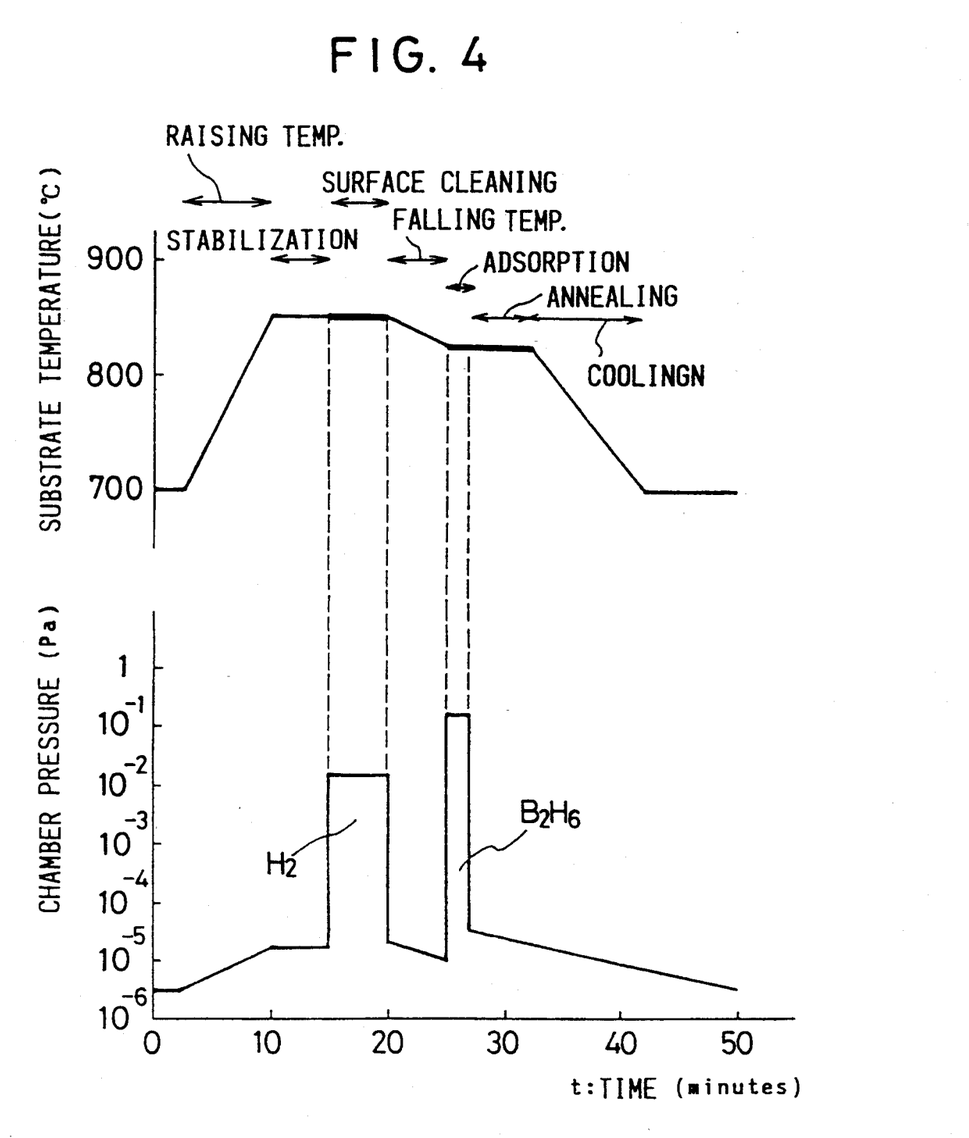
FIG. 4 is a process sequence chart of impurity doping treatment.

FIG. 4 is a process sequence chart of the cleaning and adsorption treatments carried out in the FIG. 1C and FIG. 3A steps. In the chart, the horizontal axis indicates a process time and the vertical axis indicates a substrate temperature and a chamber pressure. The substrate is held initially at 700° C., since the chamber is held normally at 700° C. so that the substrate temperature is instantly raised to 700° C. after transportation of the substrate into the chamber. The chamber is normally evacuated at less than $1 \times 10^{-4}$ Pa of high vacuum degree when a gas is not charged thereinto. The background pressure level of $1 \times 10^{-4}$ Pa is not critical, but the background pressure may be optimumly set in conjunction with the substrate temperature and the ambient gas species filled in the chamber during the surface cleaning treatment.

As described above, according to the invention, the direct adsorption of the impurity and the diffusion of the impurity are effected to the active surface of the semiconductor layer to form a source region and a drain region so as to reduce a junction depth of these regions, thereby advantageously enabling miniaturization in the device size. Particularly, the new adsorption and diffusion technology is utilized to form a P channel region to thereby improve the operation speed of CMOS transistor device. Conventionally, the P channel transistor has an operation speed lower than that of the N channel transistor.

Next, FIGS. 5A–5F show a second embodiment of the method of producing a CMOS transistor device with using the new impurity doping technology. In the FIG. 5A step, a P type semiconductor substrate 101 is formed with an N well region 102 and a P well region 103. Further, a pair of device regions 105 and 106 are defined on the substrate by a patterned field oxide film 104.

Figure 5A:
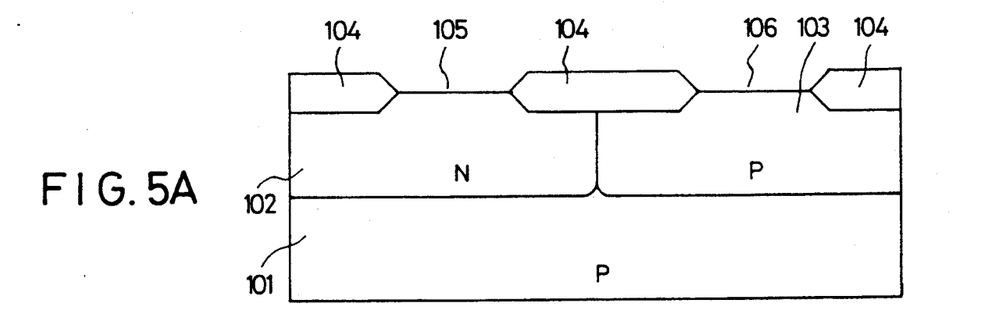
FIGS. 5A–5F are a step diagram showing a second embodiment of the inventive method of producing a CMOS transistor device.
Figure 5B:
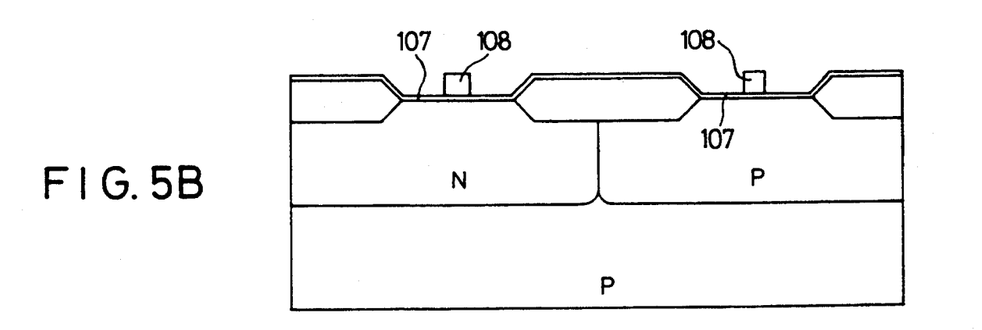

The in the FIG. 5B step, a gate oxide film 107 and a gate electrode 108 are sequentially formed in each device region.

Figure 5C:
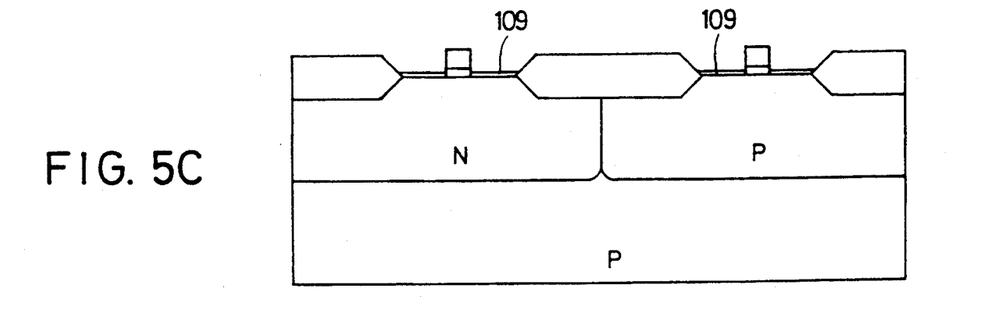

In the FIG. 5C step, the gate oxide film 107 is partly removed by etching except under the gate electrode 108 to open a window portion which is not covered by the patterned gate electrode 108. Then an adsorption film 109 composed of P type impurity of boron is formed on the window portion. The window portion is normally covered by an inert film in the form of a natural oxide film on a silicon layer of the substrate 101 even after removing the gate oxide film 107 by regular etching. This natural oxide film must be removed to expose an active silicon surface by thermally treating the substrate in vacuum prior to formation of film 109. The impurity adsorption treatment is carried out such that a diborane gas containing an impurity component of boron is applied to the exposed silicon active surface while heating the substrate 101 in vacuum to thereby form the boron adsorption film 109.

Figure 5D:
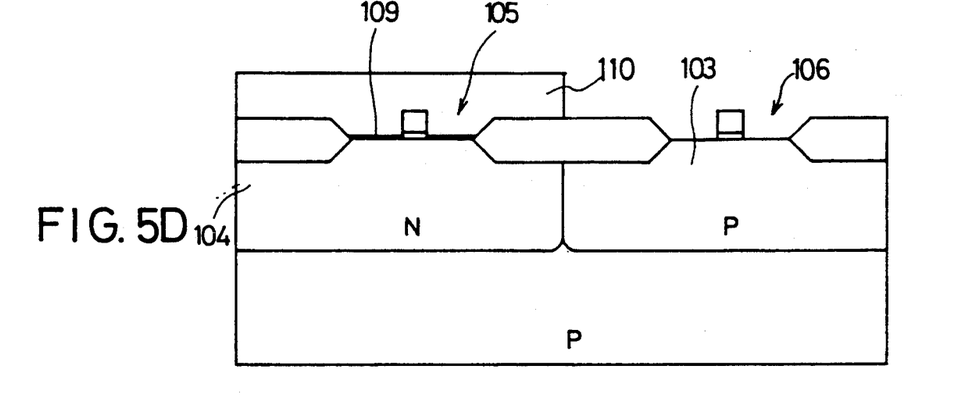

In the FIG. 5D step, the impurity adsorption film 109 is partly removed from the device region 106 on the P well region 103, while the remaining part of the impurity adsorption film 109 is covered by a resist 110 on the other device region 105 over the N well region 102. Namely, after coating the other device region 105 with the resist 110, aqueous solution of HF or aqueous solution of mixture of HF and $HNO_3$ is applied to the uncovered device region 106 to etch away the adsorption film by wet etching technology to provide an exposed surface of the P well region 103. Otherwise, dry etching technology such as reactive ion etching may be effected to remove the impurity adsorption film.

Figure 5E:
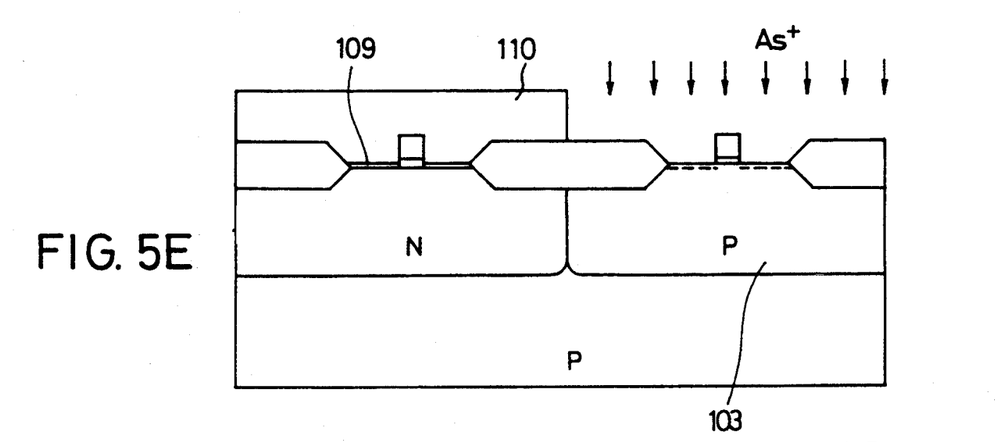

Then in the FIG. 5E step, an N type impurity of arsenic (As) is selectively doped into the P well region 103 by ion implantation.

Figure 5F:
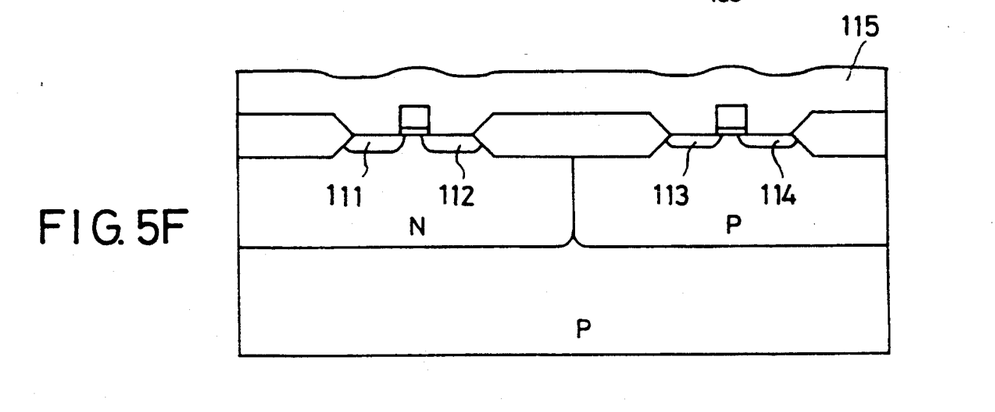

Lastly, in the FIG. 5F step the resist 110 is removed, and then an inter-layer insulating film 115 is deposited over the substrate. Thereafter, reflow treatment is effected in ambient gas of oxygen to level the inter-layer insulating film 115, and concurrently to effect diffusion of the impurities of boron and arsenic to form a pair of source region 111 and drain region 112 of PMOS and another pair of source region 113 and drain region 114 of NMOS. By such treatments, there is produced a CMOS transistor device having a shallow junction depth of the P type source region 111 and drain region 112.

Figure 6:
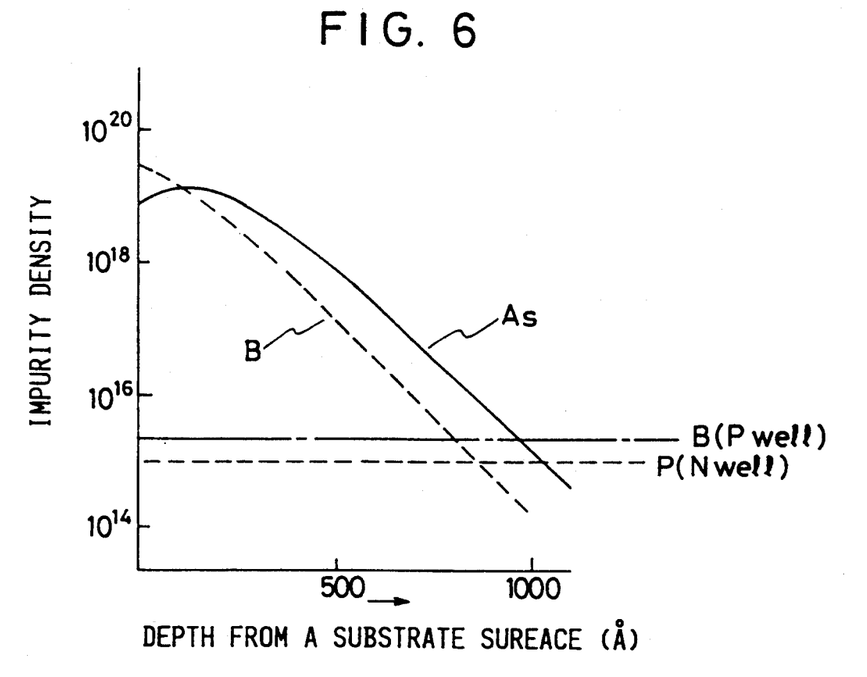
FIG. 6 is a graph showing a depth profile of the impurity density in source and drain regions.

FIG. 6 is a depth profile of the impurities of boron (B) and arsenic (As) in the CMOS transistor device produced by the FIGS. 5A–5F steps, the depth profile being measured by secondary ion mass spectrometer (SIMC). As shown in the profile, the source and drain regions of PMOS has about 850 Å of junction depth determined by a crossing point between the boron profile (B) and phosphorus profile (P) of the N well region. On the other hand, the source and drain regions of NMOS has about 960 Å of junction depth determined by a crossing point between the arsenic profile (As) and boron profile (B) of P well region. Accordingly, the inventive method can produce a CMOS transistor device having a shallow junction depth in source and drain regions of PMOS and NMOS.

FIGS. 7A-7E show a variation of the above described second embodiment, to illustrate process of forming well regions. In the FIG. 7A step, a field oxide film 104 is formed on a surface of a P type semiconductor substrate 101 to define a pair of device regions and a device separation region.

Figure 7A:
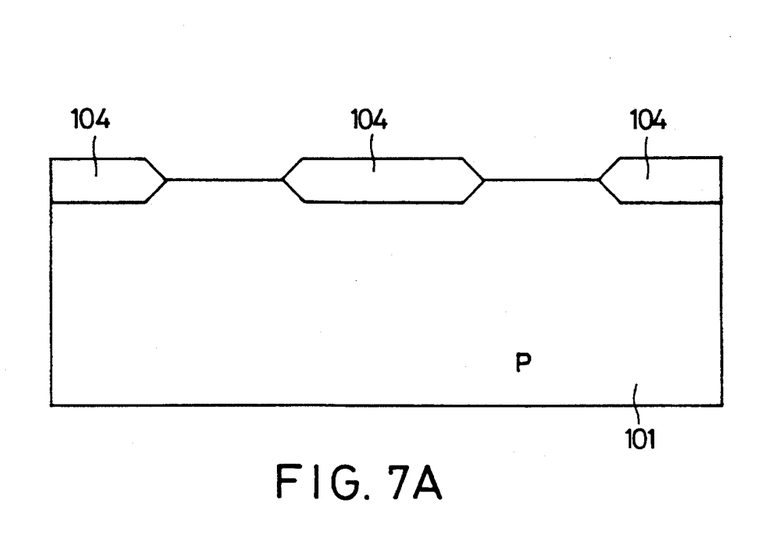
FIGS. 7A–7E are a step diagram showing formation of well regions.
Figure 7B:
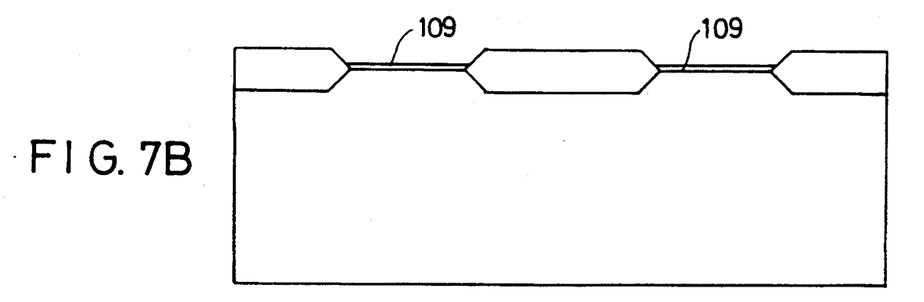

In the FIG. 7B step, an adsorption film 109 of P type impurity of boron is deposited on the pair of device regions by the new impurity doping technology.

Figure 7C:
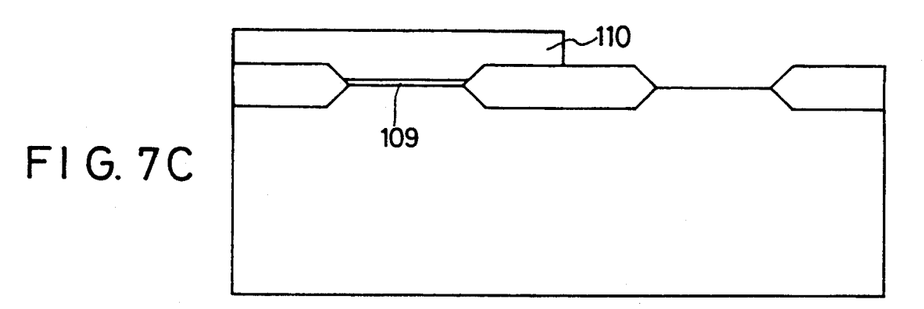

In the FIG. 7C step, one of the device regions is covered by a resist film 110, and a part of the adsorption film 109 is removed from the other uncovered device region.

Figure 7D:
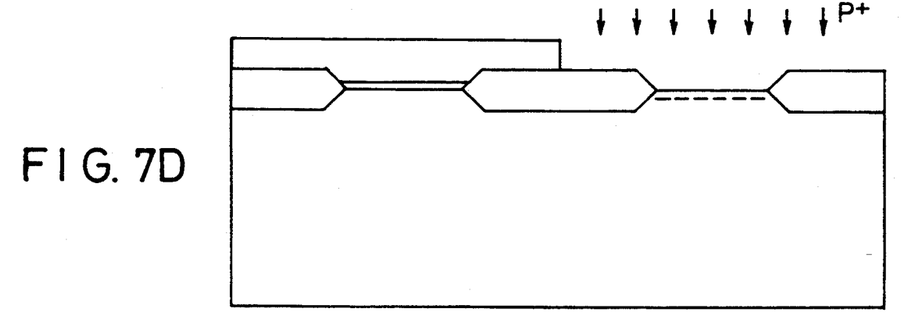

Then in the FIG. 7D step, N type impurity of phosphorus (P) is selectively doped into the other device region, from which the boron adsorption film is removed, by means of ion implantation.

Figure 7E:
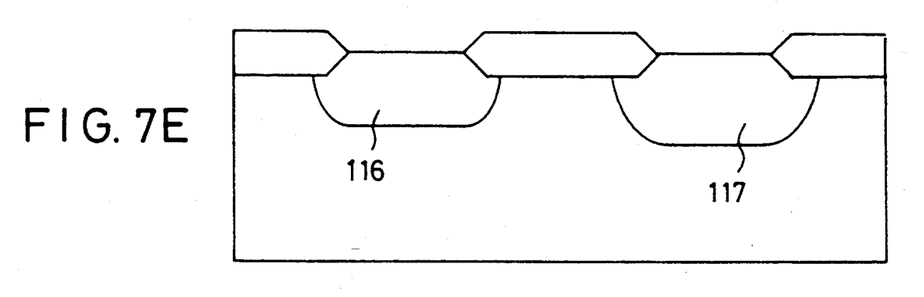

Lastly in the FIG. 7E step, the resist film 110 is removed, and the substrate is annealed to diffuse the impurities of boron and phosphorus limitatively into the device regions to form a P well region 116 and an N well region 117. According to this treatment, the well regions can be formed in the substrate in self-alignment manner through a mask of the field oxide film.

As described above, according to the second embodiment of the invention, the boron adsorption film is partly removed from one of the pair of device regions, and then an N type impurity is doped into the one of device regions by ion implantation to thereby facilitate formation of the N type impurity diffusion region.

Lastly, the third embodiment of the inventive method is described with reference to FIGS. 8A–8I. This embodiment is directed to the method of producing a specific type of the CMOS transistor device having a pair of device regions provided in a semiconductor layer in the form of a semiconductor thin film deposited on a semiconductor substrate by epitaxial silicon growth technology. This film type of the CMOS transistor device is advantageous in contrast to the before-described regular type in view of the scale-down merit of the device.

Figure 8A:
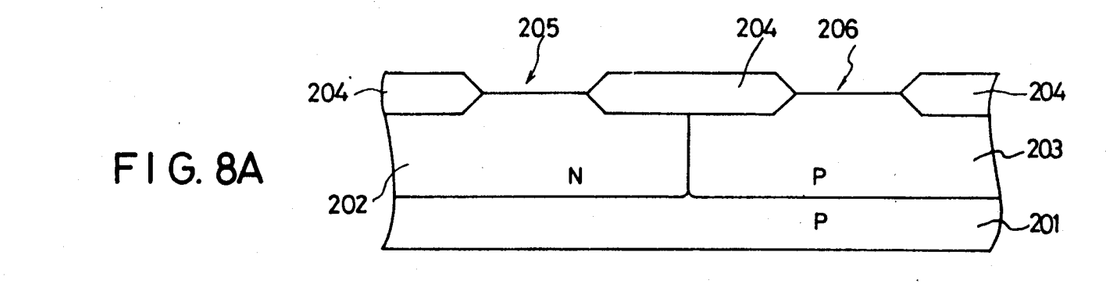
FIGS. 8A–8I are a step diagram showing a third embodiment of the inventive method of producing a CMOS transistor device.

In the FIG. 8A step, there is provided a P type silicon substrate 201. A pair of N well region 202 and P well region 203 are formed adjacently to each other in a surface of the silicon substrate 201. A first field oxide film 204 having a given pattern is formed on the silicon substrate 201 by selective thermal oxidation. An active region 205 bordered by the first field oxide film 204 is defined on the N well region 202, and another active region 206 is also defined on the P well region 203 in similar manner.

Figure 8B:
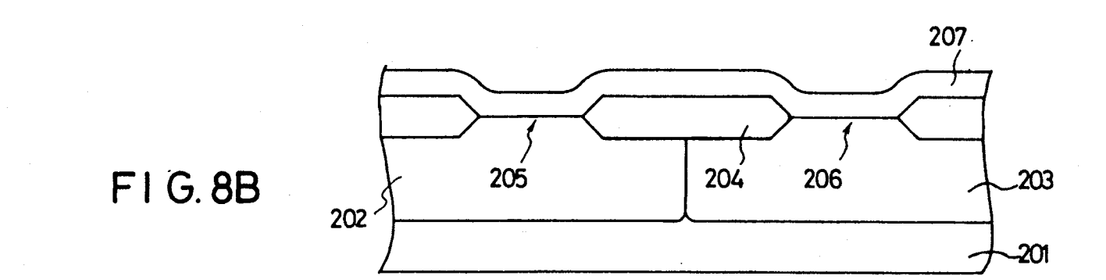

In the FIG. 8B step, a continuous silicon film 207 is deposited over the pair of active regions 205 and 206 and over the first field oxide film 204. The deposition of silicon film 207 is effected by reduced-pressure epitaxy using a silane gas (SiH$_4$) and a hydrogen gas (H$_2$) while heating the substrate at a temperature in the range from 800° C. to 1000° C. The silicon thin film 207 has a thickness less than 2000 Å. Namely, in a later step, the new impurity doping technology is utilized controllably to form a shallow profile of the impurity diffusion density in the silicon thin film 207 so that the film thickness of the epitaxially grown silicon can be effectively reduced to a degree comparable to the junction depth. On the other hand, when the impurity doping were carried out by the conventional ion implantation technology, the thickness of the silicon film should be set more than 2000 Å. According to the invention, the thickness of the silicon film 207 can be effectively reduced to there by advantageously lower a junction capacitance of source and drain regions.

Figure 8C:
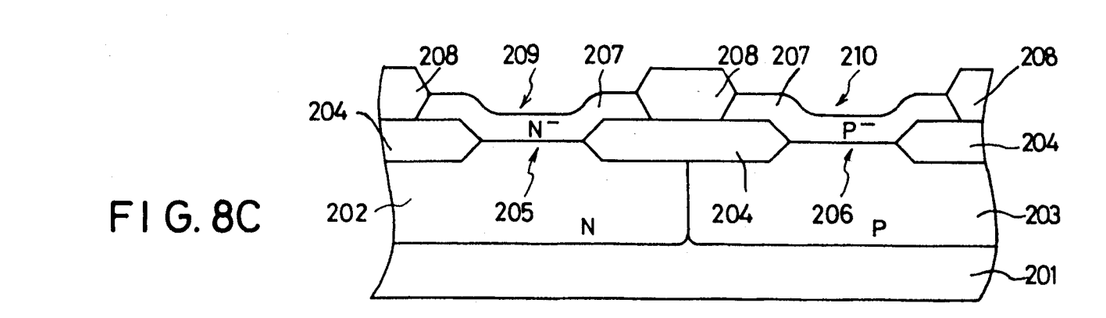

In the FIG. 8C step, the silicon film 207 is selectively thermally oxidized to form a second field oxide film 208 after a given pattern. Consequently, a part of the silicon film 207, which is not thermally oxidized, remains on the active region 205 and on a periphery of the first field oxide film 204 which surrounds the active region 205. The thus left part of the silicon film 207 defines a device region 209. In similar manner, another device region 210 is defined on the active region 206 and on a bordering periphery of the first field oxide film 208 by a left part of the silicon film 207. The thus obtained part of device regions 209 and 210 are separated from each other by the second field oxide film 208. The device regions 209 and 210 are disposed over the corresponding active regions 205 and 206 to cover them.

The semiconductor silicon film 207 is deposited on the N type of active region 205 in the form of N$^-$ type silicon single crystal, while the same silicon film 207 is deposited on the P type of active region 206 in the form of P$^-$ type silicon single crystal. As described above, a wider area of the device region is formed on a smaller area of the active region, and a transistor device is formed in the wider area of the device region to enable efficient use of the semiconductor surface spacing to thereby improve integration density of the semiconductor devices.

Figure 8D:
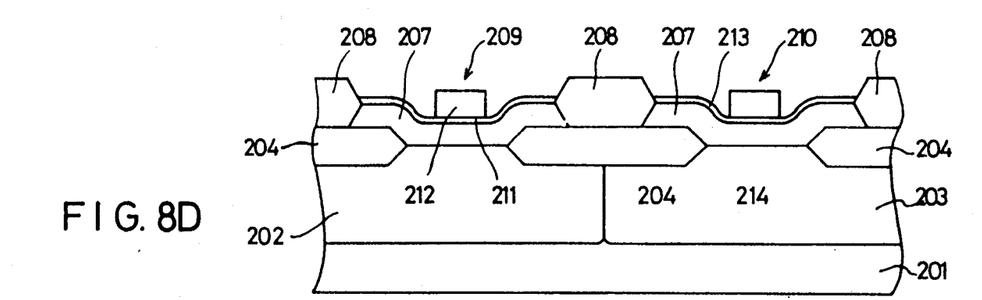

In the FIG. 8D step, a gate oxide film 211 is coated over the device region 209, and another gate oxide film 213 is coated over the device region 210. These gate oxide films are formed by wet oxidation of the silicon film 207. Subsequently, a gate electrode 212 is provided on the gate oxide film 211, and another gate electrode 214 is provided on the other gate oxide film 213. These gate electrodes 212 and 214 can be formed by depositing a polysilicon film by chemical vapor deposition and by patterning the deposited polysilicon film by photolithography technology and etching technology.

Figure 8E:
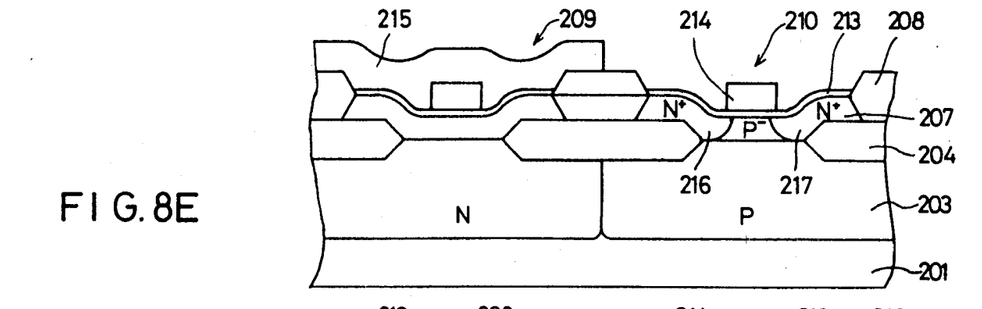

In the FIG. 8E step one device region 209 is coated by a resist film 215, while the other device region 210 is left uncovered. In this state, N type impurity of arsenic is doped into the silicon film 207 to form a pair of N$^+$ type source region 216 and N$^+$ type drain region 217. Consequently, an N channel MOS transistor is formed in the device region 210. Doping of the arsenic is carried out through a mask of the gate electrode 214 so that the impurity of arsenic is implanted into the silicon film 207 through the gate insulating film 213.

Figure 8F:
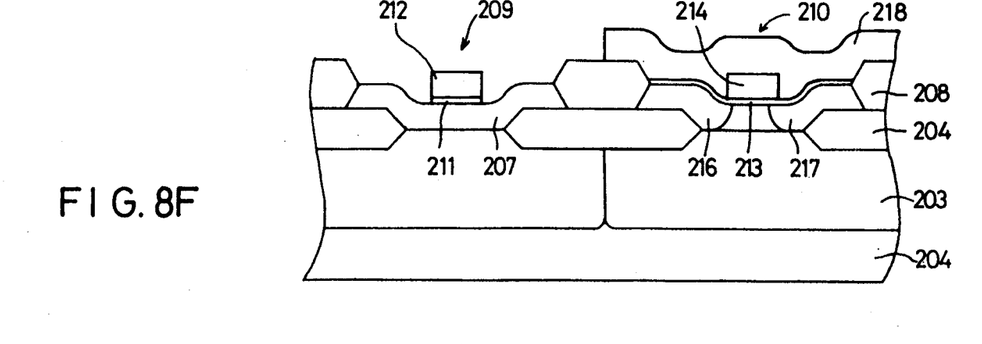

In the FIG. 8F step, the device region 210 formed with the NMOS transistor is covered by a silicon dioxide film 218, while the resist film 215 is removed from the device region 209. The coating of silicon dioxide film 218 is carried out by chemical vapor deposition over the entire area of the substrate 201 after removing the resist film 215. Then, the silicon dioxide film 218 is partly removed from the device region 209 by etching. Subsequently, the gate oxide film 211 is removed from the surface of silicon film 207 within the device region 209, and the uncovered surface of silicon film 207 is cleaned to form an exposed active surface of the silicon film 207.

Figure 8G:
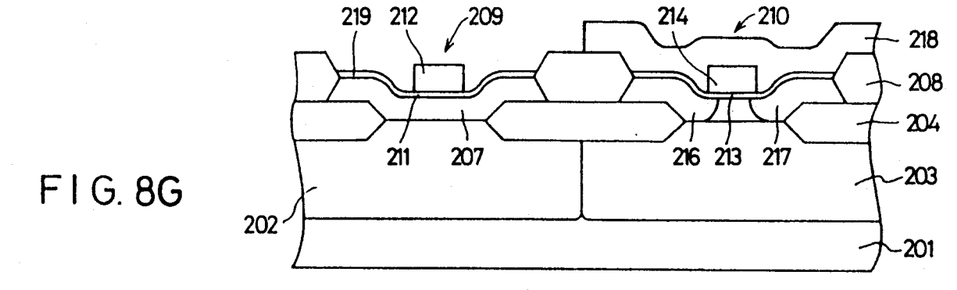

In the FIG. 8G step, diborane gas containing impurity component of boron is applied to the substrate 201 so that an adsorption film 219 containing the impurity of boron is selectively deposited only on the active face of the silicon film 207. Diborane gas is adsorbed stably and firmly on the active face of the silicon film, and is not deposited on the second field oxide film 208 and on the mask silicon dioxide film 218. This adsorption treatment is effected while heating the substrate 201, hence the mask must be composed of the silicon dioxide film 218 instead of a regular resist film of organic material.

Figure 8H:
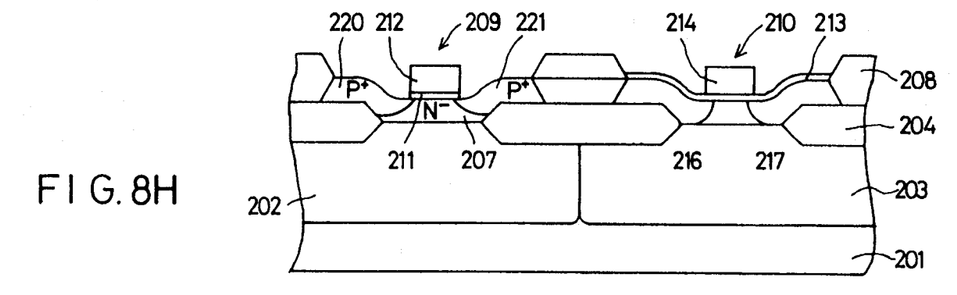

In the FIG. 8H step, the substrate 201 is subjected to thermal treatment. By heating or annealing, the impurity boron is diffused into the bulk of the silicon film 207 from the impurity adsorption film 219 by solid-phase diffusion so as to form P+ type source region 220 and P+ type drain region 221. Amount of the impurity boron contained in the adsorption film 219 is optimumly set so as to enable limitative diffusion of the boron atoms to thereby form the source region 220 and drain region 221 having a small junction capacitance. Accordingly, a P channel MOS transistor is formed in the device region 209. During the course of this annealing treatment, the impurity of arsenic doped into the device region 210 is concurrently activated. Further, the used silicon dioxide film 218 is removed.

Figure 8I:
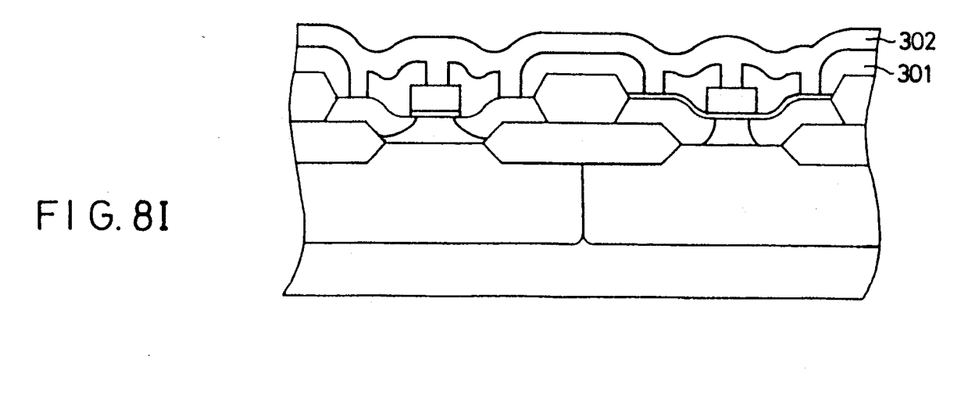

Lastly in the FIG. 8I step, an inter-layer insulating film 301 is formed on the substrate 201, and then contact holes are formed through the insulating film 301 by etching. A metal film pattern 302 is formed over the insulating film 301 to thereby complete a CMOS transistor device.

Lastly, FIGS. 9A-9D show a step diagram illustrating a variation of the third embodiment. In the FIG. 9A step, there is prepared a P type substrate 201. A pair of N well region 232 and P well region 233 are formed adjacently to each other in a surface of the substrate 201. The surface of substrate 201 is partly covered with a first field oxide film 234 except a portion on the N well region 232 to define an active region 236 and except another portion on the P well region 233 to define another active region 237. Then, the entire area of the N well region 232 is coated by a silicon dioxide film 236 by chemical vapor deposition. On the other hand, a surface of the active region 237 provided on the P well region 233 is cleaned to expose an active silicon face. This cleaning treatment is carried out by removing a natural oxide film.

Figure 9A:
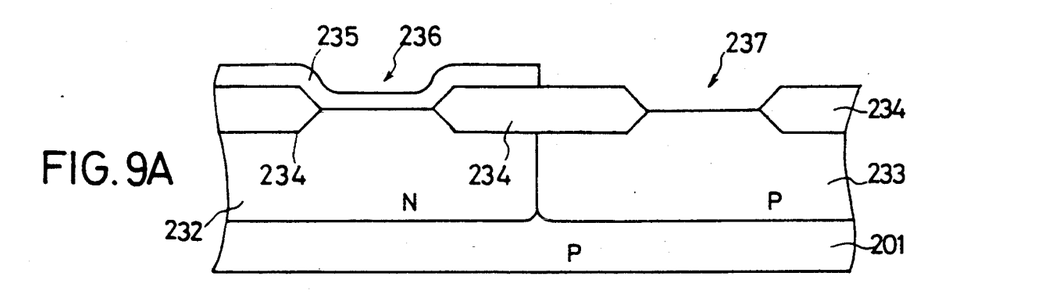
FIGS. 9A–9D are a step diagram showing a variation of the third embodiment.
Figure 9B:
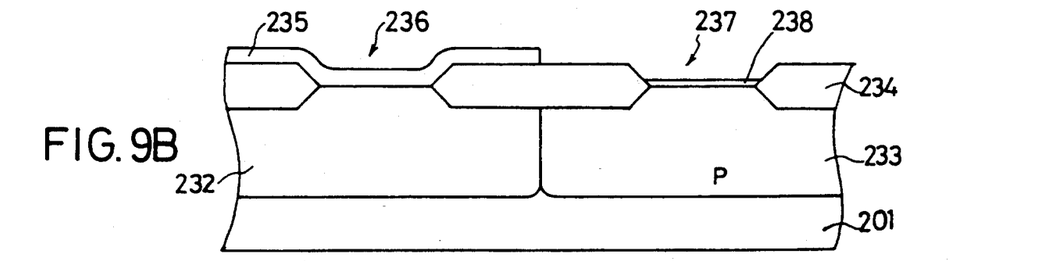

In the FIG. 9B step, diborane gas is introduced while heating the substrate 201 to deposit selectively an impurity film 238 composed of boron only on the active region 237.

Figure 9C:
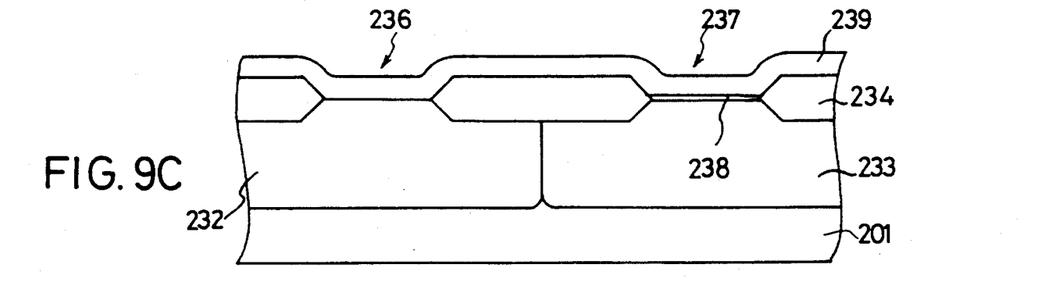

In the FIG. 9C step, a semiconductor film 239 is deposited on the entire area of the substrate 201. The semiconductor film 239 is formed by reduced-pressure epitaxial growth using a silane gas and a hydrogen gas, at less than 2000 Å of the film thickness. As apparent from the comparison between FIG. 8B and FIG. 9C, the adsorption film 238 having the P type of the impurity boron is interposed between the P well region 233 and the silicon semiconductor film 239 in this variation. This impurity deposition film 238 is provided to form a channel stopper region.

Figure 9D:
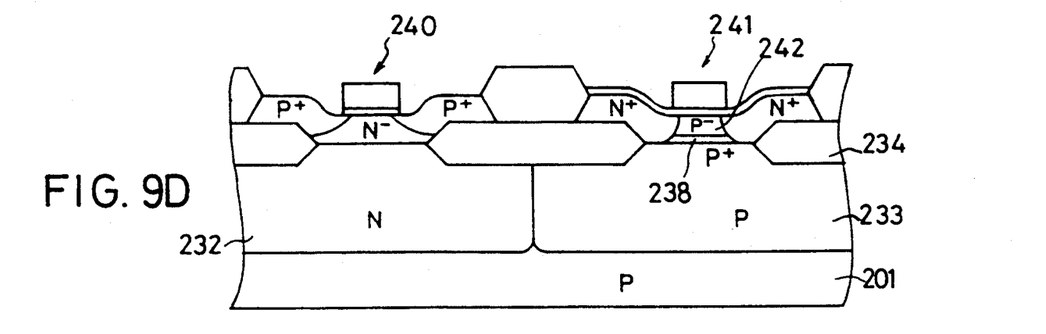

Lastly, in the FIG. 9D step, a P channel MOS transistor 240 is formed on the N well region 232, and an N channel MOS transistor 241 is formed on the P well Region 233 in manner similar to the FIG. 8C-FIG. 8H steps.

As understood from the comparison between FIG. 9D and FIG. 8H, the diffusion layer 239 containing a high density of impurity boron is interposed at a boundary between a channel region 242 of the N channel transistor 241 and the P well region 233 in this variation.

This P+ type diffusion layer 238 is caused from the adsorption film 238 of the boron impurity deposited in the FIG. 9B step to function as a channel stopper region. Namely, the channel stopper region suppresses expansion of depletion layers positioned at opposite ends of the channel region 242 in the channel direction to avoid punch-through and short channel effect which would cause defects of the device.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing a CMOS transistor device, comprising:

the first step of forming a P type MOS device region and an N type MOS device region adjacent to each other in a surface portion of a semiconductor substrate;

the second step of forming sequentially a gate insulating film and a gate electrode on the gate insulating film on each of the device regions;

the third step of removing the gate insulating film on each of the device regions using the associated gate electrode as a mask, and then exposing an active semiconductor surface on each of the device regions;

the fourth step of applying a gas containing an impurity component of P conductivity type to the exposed active semiconductor surface to form thereon an adsorption film composed of the impurity component of P conductivity type;

the fifth step of forming a resist layer on the P type MOS device region;

the sixth step of removing the adsorption film formed in the fourth step from the N type MOS device region, using the resist layer formed in the fifth step as a mask;

the seventh step of ion implanting an N conductivity type impurity component into the N type MOS device region to form N type MOS device source and drain regions using the resist layer as a mask; and the eighth step of effecting solid-phase diffusion of the impurity component of P conductivity type from a diffusion source composed of the adsorption film to form source and drain regions of P conductivity type in said P type MOS device region.

2. A method according to claim 1, wherein said fourth step comprises heating the substrate to a temperature at about 800° C. to form the adsorption film on the exposed active semiconductor surface.

3. A method according to claim 1, wherein the fourth step comprises applying a diborane gas containing a P type impurity component of boron to the active semiconductor surface to form an adsorption film containing the P type impurity component of boron.

* * * * *